(12) United States Patent  
Eikenbroek et al.

(10) Patent No.: US 7,480,343 B2
(45) Date of Patent: Jan. 20, 2009

(54) TRANSCEIVER ARCHITECTURE WITH REDUCED VCO-PULLING SENSITIVITY

(75) Inventors: Johannes Wilhelmus Eikenbroek, Emmen (NL); Paulus Thomas Maria Van Zeijl, Veldhoven (NL)

(73) Assignee: Ericsson Technology Licensing AB, Lund (SE)

( * ) Notice: Subject to any disclaimer, the term of this patent is extended or adjusted under 35 U.S.C. 154(b) by 840 days.

(21) Appl. No.: 10/884,970

(22) Filed: Jul. 7, 2004

(65) Prior Publication Data

US 2005/0036566 A1    Feb. 17, 2005

Related U.S. Application Data

(60) Provisional application No. 60/487,259, filed on Jul. 16, 2003.

(51) Int. Cl.
H04L 27/00      (2006.01)
(52) U.S. Cl. ...................................................... 375/295
(58) Field of Classification Search ................. 375/295, 375/376, 371
See application file for complete search history.

(56) References Cited

U.S. PATENT DOCUMENTS

| | | | | |
|---|---|---|---|---|
| 4,313,209 | A * | 1/1982 | Drucker | 455/112 |
| 5,095,536 | A | 3/1992 | Loper | |
| 5,239,686 | A | 8/1993 | Downey | |
| 5,821,816 | A * | 10/1998 | Patterson | 331/1 A |
| 6,282,413 | B1 | 8/2001 | Baltus | |
| 6,321,074 | B1 | 11/2001 | Lemay | |
| 6,542,722 | B1 * | 4/2003 | Sorrells et al. | 455/110 |

(Continued)

FOREIGN PATENT DOCUMENTS

EP    0335037 A1    10/1989

(Continued)

OTHER PUBLICATIONS

PCT International Search Report dated Nov. 30, 2004 in connection with International Application No. PCT/EP2004/007558.

(Continued)

*Primary Examiner*—Chieh M Fan
*Assistant Examiner*—Jaison Joseph
(74) *Attorney, Agent, or Firm*—Potomac Patent Group PLLC

(57) ABSTRACT

An output signal is generated for transmission in a telecommunications systems. This may involve generating an in-phase radio frequency signal by mixing an in-phase baseband signal with a first radio frequency mixer signal; and generating an alternative-phase radio frequency signal by mixing an alternative-phase baseband signal with a second radio frequency mixer signal. An output signal for transmission is generated by combining the in-phase radio frequency signal with the alternative-phase radio frequency signal, wherein the output signal has a frequency, $f_{RF}$. The first and second radio frequency mixer signals are generated by generating a voltage controlled oscillator (VCO) output signal having a frequency, $f_{VCO}$, such that $$f_{VCO} = \left(n + \frac{1}{2}\right) \cdot f_{RF},$$

wherein n=1, 2, 3, . . . ; and generating one or more fractional frequency divided signals from the VCO output signal, wherein each of the one or more fractional frequency divided signals has a frequency equal to $f_{RF}$.

28 Claims, 7 Drawing Sheets

U.S. PATENT DOCUMENTS

| | | | |
|---|---|---|---|
| 6,703,901 B2 * | 3/2004 | Jovenin et al. | 331/1 A |
| 6,845,139 B2 * | 1/2005 | Gibbons | 377/47 |
| 2001/0041546 A1 | 11/2001 | Kazakevich | |
| 2002/0081983 A1 | 6/2002 | Brunel et al. | |
| 2002/0180538 A1 | 12/2002 | Soorapanth et al. | |

FOREIGN PATENT DOCUMENTS

| | | |
|---|---|---|
| EP | 0620667 A1 | 10/1994 |
| EP | 0643494 A1 | 3/1995 |
| EP | 1271792 A1 | 1/2003 |

OTHER PUBLICATIONS

PCT Written Opinion dated Nov. 30, 2004 in connection with International Application No. PCT/EP2004/007558.

Razavi, B. "Challenges in Portable RF Transceiver Design" IEEE Circuits and Devices Magazine, IEEE Inc., New York, U.S. vol. 12, No. 5, Sep. 1996, pp. 12-25, XP000831610.

International Preliminary Report on Patentability, completed Dec. 5, 2005, in connection with International Application No. PCT/EP2004/007558.

Stetzler, T.D. et al.: "A 2.7-4.5 V Single Chip GSM Transceiver RF Integrated Circuit", IEEE Journal of Solid-State Circuits, IEEE Service Center, Piscataway, NJ, US, vol. 30, No. 12, Dec. 1995, pp. 1421-1428, XP000557247, ISSN: 0018-9200.

Zheng, Y. et al.: "Self tuned fully integrated high image rejection low IF receivers: architecture and performance", Proceedings of the 2003 IEEE International Symposium on Circuits and Systems, Piscataway, NJ, US, vol. 30, No. 12, May 28, 2003, pp. 165-168, ISSN: 0-7803-7761-3.

* cited by examiner

TRANSCEIVER ARCHITECTURE WITH REDUCED VCO-PULLING SENSITIVITY

CROSS REFERENCE TO RELATED APPLICATIONS

This application claims the benefit of U.S. Provisional Application No. 60/487,259, filed Jul. 16, 2003, which is hereby incorporated herein by reference in its entirety.

BACKGROUND

The present invention relates to telecommunications, and more particularly to apparatuses and techniques for transmitting and receiving radio frequency signals while reducing VCO-pulling sensitivity.

In radio frequency communications, information to be communicated is typically generated at an initial relatively low, so-called "baseband" frequency. This baseband frequency signal is then processed in a way that results in the information being imposed on a much higher, radio frequency signal. This processing is often referred to as "up-converting." In the receiver, a reverse process (called "down-converting") is performed on the received radio frequency signal to re-create the original baseband frequency signal.

Many different transmitter and receiver architectures are known. In some, the initial signal (baseband for transmitters, radio frequency for receivers) is first up- or down-converted to one or more intermediate frequencies. These intermediate frequency (IF) signals may then be subjected to further processing before ultimately being up- or down-converted to the respective radio frequency (RF) or baseband signal (depending on whether transmission or reception is being performed).

In these so-called "non-zero IF" up- or down-conversion systems, undesired signals oscillating at an image frequency can leak into the system, creating spurious IF signals. A measure of the quality of a transmitter or receiver is its image rejection ratio, which is defined as the ratio of (a) the IF signal level produced by the desired input frequency to (b) that produced by the image frequency. In most applications found in modem communications, however, it is very difficult to design a non-zero IF architecture that meets an imposed image rejection requirement. For this reason, designers often choose a zero-IF up- and down-conversion approach, in which baseband and radio frequency signals are converted directly from one to the other.

Another aspect of modem telecommunications is how the information will be imposed on the radio frequency signal. A common approach is to impose some of the information on a first, in-phase signal, and to impose the remainder of the information on a second, quadrature signal. The in-phase and quadrature signals are then combined to form the final signal that will be communicated between the transmitter and the receiver. The resultant analog signal is one in which each combination of phase and (possibly) amplitude represents one of a number of n-bit patterns (n is an integer). (The term "quadrature" pertains to the phase relationship between two periodic quantities varying with the same frequency when the phase difference between them is one-quarter of their period; that is, the two periodic quantities are $\pi/2$ radians out of phase with respect to one another.) Quadrature Phase Shift Keying (QPSK) and Quadrature Amplitude Modulation (QAM) are two well-known examples of this type of modulation.

FIG. 1 is a block diagram of a conventional zero-IF transceiver 100. The transceiver 100 includes a transmitter 101 and a receiver 103. As can be seen in the figure, for the sake of efficiency the transceiver 100 includes a synthesizer 105 that is shared by the transmitter 101 and the receiver 103. It should be recognized that, in general, transmitters and receivers can be constructed separately, each with its own synthesizer.

Focusing now on the transmitter 101, information in the form of bits to be transmitted are supplied to digital logic 107. The digital logic 107 may perform a number of functions that are not illustrated here, such as generating redundant bits in accordance with a Forward Error Correction (FEC) scheme. One function that the digital logic 107 does perform in this example is generating quadrature modulation signals $A(t) \cdot \cos(\theta(t))$ and $A(t) \cdot \cos(\theta(t) + \pi/2)$ from the supplied input bits. $A(t)$ and $\theta(t)$ will depend on the type of modulation used in the transmitter (e.g., PSK, FSK, ASK, etc.). One of the signals $A(t) \cdot \cos(\theta(t))$ and $A(t) \cdot \cos(\theta(t) + \pi/2)$ is supplied to an in-phase transmit path, and the other of the two generated signals is supplied to a quadrature-phase transmit path. It will be observed, then, that the digital logic 107 ensures a $\pi/2$ radians phase difference between the bits supplied to the in-phase and quadrature-phase transmit paths. In each of these paths, the bits supplied by the digital logic 107 are converted to analog form by a digital to analog (D/A) converter 109. The analog signal supplied by the digital to analog converter 109 is then conditioned for transmission by a low pass filter (LPF) 111. The conditioned analog signal is then directly up-converted to the radio frequency that will be used for transmission by mixing the signal (via a mixer 113) with a radio frequency signal generated by the synthesizer 105.

The quadrature relationship between the two transmit signal paths is also accomplished by supplying a first radio frequency signal to the mixer 113 associated with the in-phase transmit path, and a second radio frequency signal to the mixer 113' associated with a quadrature-phase transmit path, wherein there is a $\pi/2$ radians phase difference between the first and second radio frequency signals. The in-phase and quadrature-phase signals supplied by the mixers 113 and 113' are then combined 115 and supplied to a power amplifier 117, which boosts the strength of the signal so that it can be transmitted through an antenna 119.

In the conventional transceiver 100, the synthesizer 105 generates the radio frequency signals to be supplied to the mixers 113, 113' by means of a phase locked loop. Accordingly, a reference signal is supplied to phase difference circuitry 121 whose output represents the phase difference between the reference signal and a signal related to the output of the synthesizer 105. The phase difference signal supplied by the phase difference circuitry 121 is then conditioned by a low pass filter 123. The conditioned signal is used to control the frequency of an output signal generated by a voltage controlled oscillator (VCO) 125. In this case, the output signal supplied by the VCO 125 oscillates at twice the desired radio frequency so it is supplied to a divide-by-two circuit 127 which generates both the in-phase and quadrature-phase radio frequency signals needed by the transmitter 101 and (in this example) the receiver 103. These signals represent the outputs of the synthesizer 105. One of the output signals supplied by the divide-by-two circuit 127 is also supplied to a divide-by-N frequency divider 129, whose output is 1/N times the frequency of the synthesizer output signals. The frequency-divided signal supplied at the output of the divide-by-N frequency divider 129 is the above-mentioned signal related to the output of the synthesizer 105, which signal is supplied as one of the inputs to the phase difference circuitry 121.

The relevant features of the receiver 103 essentially perform the inverse operations of those found in the transmitter 101, and are therefore not described here.

One problem encountered in zero-IF transmitter arrangements is the occurrence of signal coupling between the radio frequency power amplifier and the tank circuit of the VCO by capacitive or inductive means. This problem, which is called VCO-pulling, is very difficult to avoid when the VCO is designed to run at the same frequency as the frequency of the output signal to be transmitted. This is an especially large problem went operating frequencies are in the gigahertz range.

One way of decreasing this pulling is to choose a VCO frequency unequal to the frequency of the output-signal. A common choice is $f_{VCO} = 2 \cdot f_{RF}$, as illustrated in FIG. 1. Running the VCO at twice the frequency of the transmitted radio frequency signal also makes it easy to generate the quadrature signals which are required for up-conversion of the modulated signal, which is generated at 0 Hz (see the divide by two circuit 127 illustrated in FIG. 1). However, even for this configuration, harmonics of the output signal (e.g., those present in the supply line or those generated by distortion of the RF-signal in the power amplifier itself) still cause pulling of the VCO. This is illustrated by the signal leakage path 131 illustrated in FIG. 1, which permits spurious signals having frequencies at $$n \cdot \left( \omega_0 + \frac{d\theta(t)}{dt} \right),$$

where n is an integer, to leak from the power amplifier 117 to the VCO 125.

It is therefore desirable to provide apparatuses and methods that avoid any pulling of the VCO by radio frequency signals present in the transmitter, because this VCO-pulling deteriorates the spectral purity of the transmitter output signal and consequently prevents the transmitter from satisfying test specification requirements covering transmitter modulation accuracy. It is further desirable to avoid this VCO pulling because the resultant local oscillator signals have an undesirable spectrum which, if supplied to the mixer of a receiver, can reduce the receiver's ability to handle interfering signals.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses for generating an output signal for transmission in a telecommunications system. In some embodiments, this involves generating an in-phase radio frequency signal by mixing an in-phase baseband signal with a first radio frequency mixer signal; and generating an alternative-phase radio frequency signal by mixing an alternative-phase baseband signal with a second radio frequency mixer signal. An output signal for transmission is generated by combining the in-phase radio frequency signal with the alternative-phase radio frequency signal, wherein the output signal has a frequency, $f_{RF}$. The first and second radio frequency mixer signals are generated by generating a voltage controlled oscillator (VCO) output signal having a frequency, $f_{VCO}$, such that $$f_{VCO} = \left( n + \frac{1}{2} \right) \cdot f_{RF},$$

wherein n=1, 2, 3, . . . ; and generating one or more fractional frequency divider output signals from the VCO output signal, wherein each of the one or more fractional frequency divided signals has a frequency equal to $f_{RF}$.

In some embodiments, for example, n=1.

In some embodiments in which n=1, the fractional frequency divider is a divide-by-N fractional frequency divider with N=3/2; and the synthesizer comprises circuitry that generates the first and second radio frequency mixer signals from at least one of the one or more fractional frequency divider output signals such that the first and second radio frequency mixer signals have a relative phase difference of $\pi/2$ radians.

In some other embodiments in which n=1, the fractional frequency divider is a divide-by-N fractional frequency divider with N=3/2; and the fractional frequency divider generates a second fractional frequency divider output signal from the VCO output signal, wherein the second fractional frequency divider output signal has a frequency equal to $f_{RF}$, and a relative phase difference between the first and second fractional frequency divider output signals is $\alpha$ radians, wherein $|\alpha| \neq \pi/2$. In some embodiments, for example, $|\alpha| = 2\pi/3$.

In another aspect of some embodiments, generating the output signal for transmission involves generating the first and second radio frequency mixer signals from the first and second fractional frequency divider output signals such that a relative phase difference between the first and second radio frequency mixer signals is $\alpha$ radians; and generating the in-phase and alternative-phase baseband signals such that a relative phase difference between the in-phase and alternative-phase baseband signals is $\alpha$ radians. Here as well, in some embodiments, for example, $|\alpha| = 2\pi/3$.

In yet another aspect of some embodiments, a fractional frequency divider is used to perform frequency division of the VCO output signal, where the fractional frequency divider comprises logic that, for every three successive transitions of the VCO output signal, generates the first fractional frequency divider output signal such that the first fractional frequency divider output signal transitions in response to each of first and second transitions of the three successive transitions of the VCO output signal, and the first fractional frequency divider output signal remains steady in response to a third transition of the three successive transitions of the VCO output signal; and logic that, for said every three successive transitions of the VCO output signal, generates the second fractional frequency divider output signal such that the second fractional frequency divider output signal transitions in response to each of the second and third transitions of the three successive transitions of the VCO output signal, and the second fractional frequency divider output signal remains steady in response to the first transition of the three successive transitions of the VCO output signal.

In still another aspect of the invention, a transceiver utilizing any of the above aspects also performs receiver functions that include generating a first mixed signal by mixing a received radio frequency signal with a third radio frequency mixer signal; and generating a second mixed signal by mixing the received radio frequency signal with a fourth radio frequency mixer signal, wherein a relative phase difference between the third and fourth radio frequency mixer signals is $\alpha$ radians. An in-phase receiver signal and a quadrature-phase receiver signal are generated from the first and second mixed signals, wherein a relative phase difference between the in-phase receiver signal and the quadrature-phase receiver signal is π/2 radians. For example, the third radio frequency mixer signal may be the first radio frequency mixer signal; and the fourth radio frequency mixer signal may be the second radio frequency mixer signal.

In some embodiments, α=π2/3, and the in-phase receiver signal, i(t), and the quadrature-phase receiver signal, q(t), are generated from the first mixed signal, x(t), and the second mixed signal, y(t), in accordance with:

$$i(t) = x(t)$$
$$q(t) = \frac{1}{\sqrt{3}}x(t) + \frac{2}{\sqrt{3}}y(t).$$

In alternative embodiments, the in-phase receiver signal, i(t), is generated in accordance with a first function that includes adding the first mixed signal, x(t), and the second mixed signal, y(t); and the quadrature-phase receiver signal, q(t), is generated in accordance with a second function that includes determining a difference between the first mixed signal, x(t), and the second mixed signal, y(t). In one of any number of examples, α=2π/3, and the first function is:

$$i(t)=x(t)+y(t);$$

and the second function is:

$$q(t) = \frac{1}{\sqrt{3}}x(t) - \frac{1}{\sqrt{3}}y(t).$$

In still other aspects of the invention, the various transmitter and receiver functions may be embodied in stand-alone units; that is, they need not be embodied together in a single transceiver.

BRIEF DESCRIPTION OF THE DRAWINGS

The objects and advantages of the invention will be understood by reading the following detailed description in conjunction with the drawings in which.

DETAILED DESCRIPTION

Figure 1:
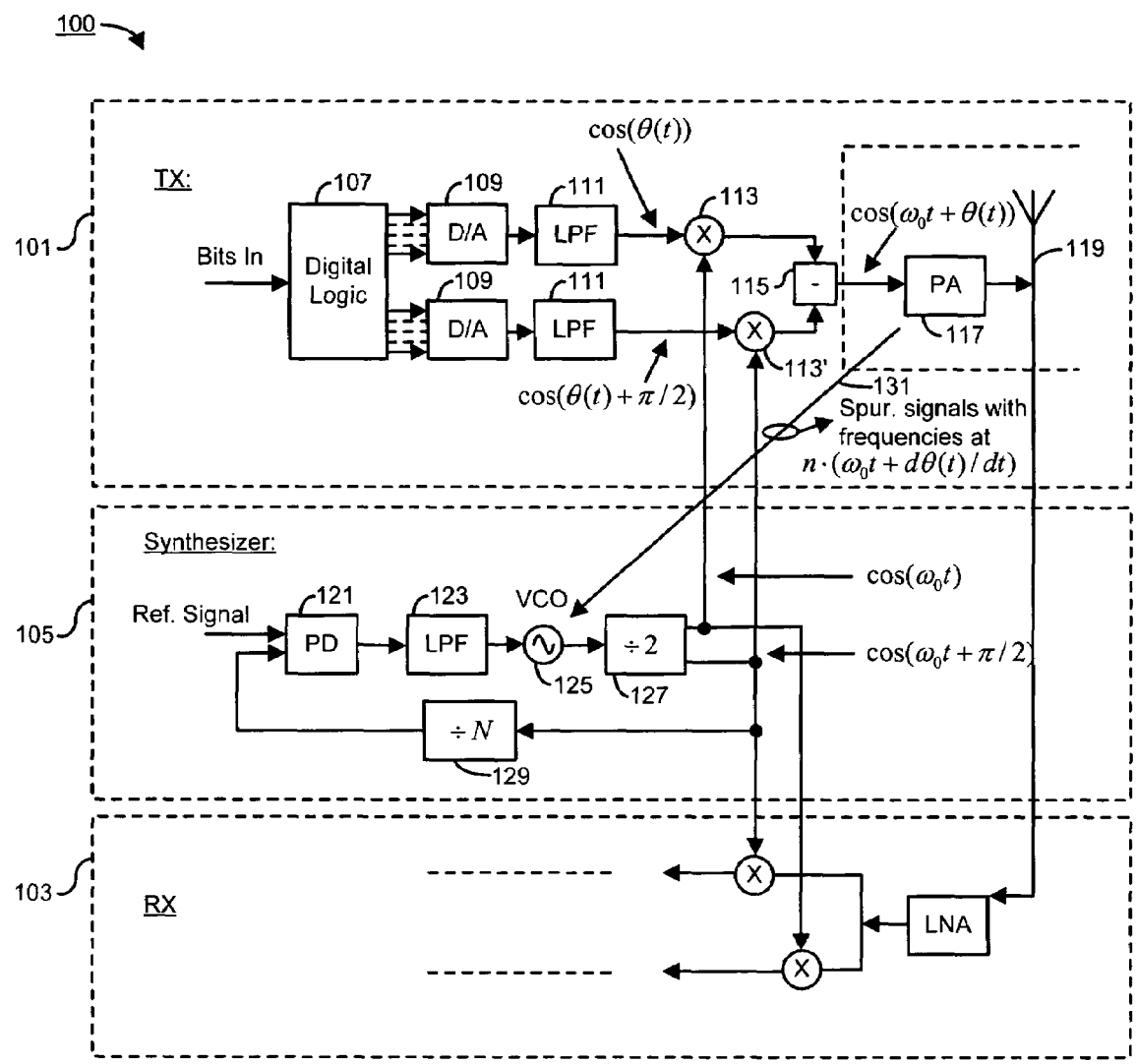
FIG. 1 is a block diagram of a conventional zero-IF transceiver 100.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

As mentioned in the Background section, a problem with all conventional zero-IF up-conversion systems is that there is always a harmonic of the transmitter's output radio frequency signal that is equal to the VCO frequency due to the integer relation between the VCO frequency and the output-frequency of the transmitter.

In seeking a solution to this problem, the inventors have noted that the VCO circuit is most sensitive to spurious input signals when the frequencies of those spurious signals are close to the oscillating frequency of the VCO. The greater the frequency difference between the spurious signal and the VCO operating frequency, the less sensitive to those spurious input signals the VCO becomes.

Thus, in accordance with an aspect of the invention, a transmitter and methods of transmitting are provided in which the operating frequency of the VCO is related to the frequency of the transmitter output signal according to:

$$f_{VCO} = \left(n + \frac{1}{2}\right) \cdot f_{RF},$$

where n is an integer such that n≧1.

In some embodiments, it is advantageous to choose $f_{VCO}=1.5 \cdot f_{RF}$. When this relationship is selected, it is necessary to perform fractional frequency division of the VCO output signal by an amount N=3/2 in order for the synthesizer (also referred to as "local oscillator" or "LO") to generate, from the VCO output, mixer-switching signals whose frequency matches that of the transmitter output signal (i.e., $f_{LO}=f_{RF}$). A fractional divider having a division factor of N=3/2 may therefore be used to accomplish this.

Figure 2A:
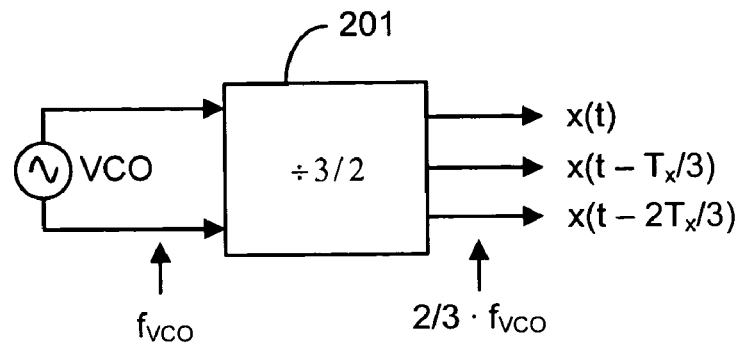
FIG. 2A is a block diagram of an exemplary frequency divider in accordance with an aspect of the invention.

In accordance with another aspect of the invention, this can be accomplished by a fractional frequency divider that bases its output signals on both the rising and falling zero-crossings (i.e., the leading and trailing edges) of the VCO output signal. Such a frequency divider 201 is shown in FIG. 2A, and the relationship between its input and output signals is illustrated in the timing diagram of FIG. 2B.

The fractional frequency divider 201 receives from the VCO a signal having a frequency $f_{VCO}$. The fractional frequency divider 201 generates therefrom three output signals: x(t), x(t−$T_x$/3), and x(t−2$T_x$/3). The fractional frequency divider 201 produces each of these output signals by generating a signal that transitions (i.e., either goes high if it is already low, or goes low if it is already high) for each of two successive transitions of the input VCO signal, and then causes the generated signal to remain steady when a third transition of the input VCO signal occurs. This pattern is repeated for every three successive transitions of the input VCO signal.

Figure 2B:
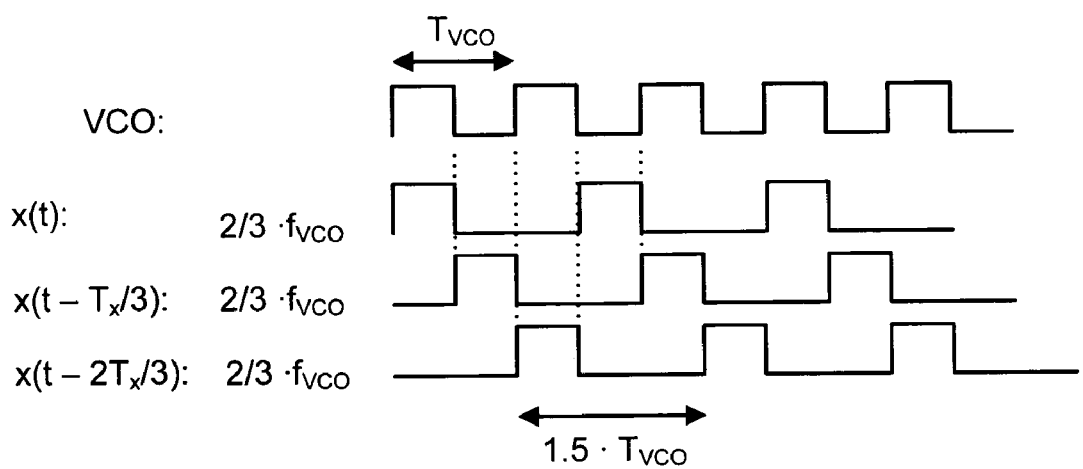
FIG. 2B is a timing diagram illustrating the relationship between input and output signals of the exemplary frequency divider of FIG. 2A.

It is possible to select any transition of the VCO input signal as the start of the three-transition sequence from which an output signal will be generated. Each of these possibilities is therefore illustrated in FIG. 2B: a first leading edge of the input VCO signal is the beginning of a three transition sequence for the output signal x(t); a first trailing edge of the input VCO signal is the beginning of a three transition sequence for the output signal x(t−$T_x$/3); and a second leading edge of the input VCO signal is the beginning of a three transition sequence for the output signal x(t−2$T_x$/3). As shown in FIG. 2B, each of the output signals supplied by the fractional frequency divider 201 has a duty cycle of ⅓. The magnitude of the relative phase difference between any two of the output signals x(t), x(t−$T_x$/3), and x(t−2$T_x$/3) is 120° (2π/3 radians).

Figure 3A:
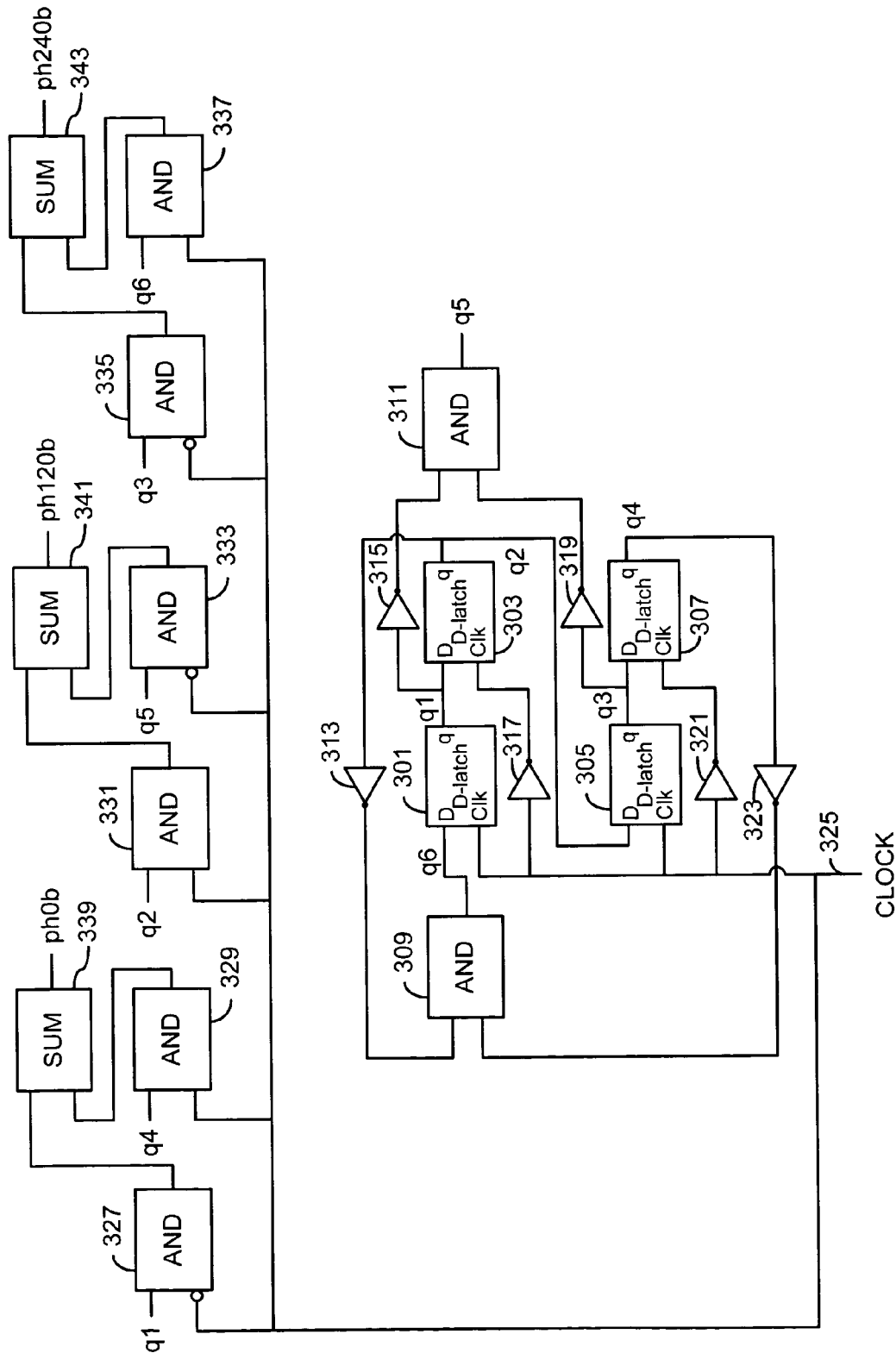
FIG. 3A is a schematic diagram of an exemplary embodiment of a fractional frequency divider that may be used in accordance with an aspect of the invention.
Figure 3B:
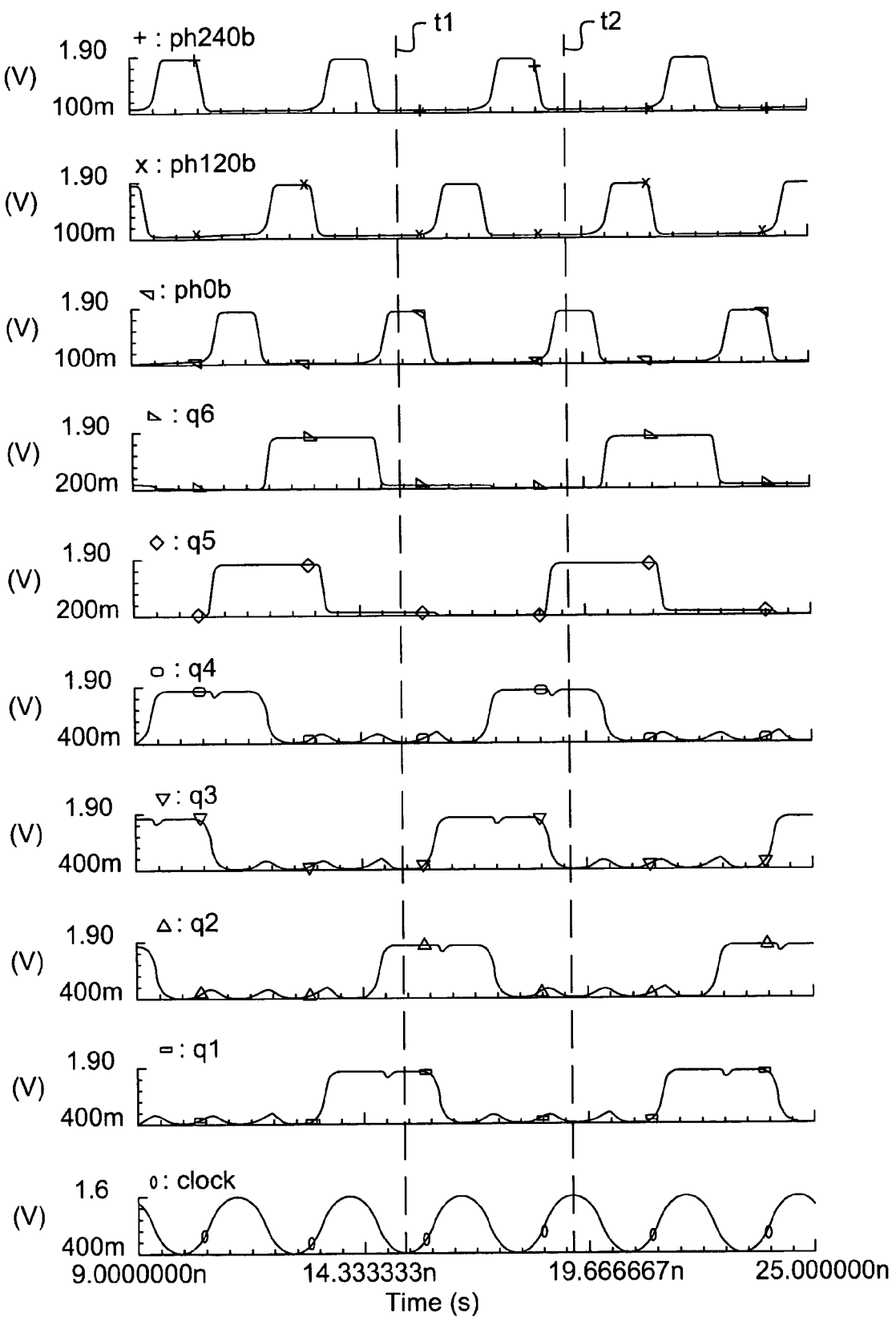
FIG. 3B is a timing diagram showing the relationship between various waveforms associated with the exemplary embodiment of the fractional frequency divider depicted in FIG. 3A.

An exemplary embodiment of the fractional frequency divider 201 is depicted in FIG. 3A. Waveforms associated with this exemplary embodiment are depicted in FIG. 3B. To facilitate the description, only a single ended implementation of the fractional frequency divider 201 is depicted in FIG. 3A. However, in practice it is preferred that any such implementation be fully differential.

In the lower part of FIG. 3A, it can be seen that the fractional frequency divider 201 comprises first, second, third, and fourth D-latches 301, 303, 305, 307; first and second AND gates 309, 311; and first, second, third, fourth, fifth, and sixth inverters 313, 315, 317, 319, 321, and 323, all interconnected to form a divider state machine. The state machine is clocked by an input clock signal 325 having a frequency $f_{clock}$. In order to enable the state machine to be responsive to both the leading and trailing edges of the input clock signal 325, the first and third D-latches 301, 305 are clocked directly by the input clock signal 325, while the second and fourth D-latches 303, 307 receive an inverted form of the clock from a respective one of the third and fourth inverters 317, 321.

Six output signals, q1, q2, q3, q4, q5, q6, are generated by the state machine portion of the fractional frequency divider. These six signals, which are among those illustrated in FIG. 3B, all have an output frequency of $f_{clock}$/3, and each is delayed in time by half a clock period relative to another one of the signals. That is, q2 is delayed by $T_{clock}$/2 (i.e., half the period of the input clock signal 325) relative to q1, q3 is delayed by $T_{clock}$/2 relative to q2, and so on.

Another part of the fractional frequency divider, which is depicted in the upper part of FIG. 3A, comprises third, fourth, fifth, sixth, seventh, and eighth AND gates 327, 329, 331, 333, 335, 337; and first, second, and third SUM blocks 339, 341, and 343 configured to generate three output signals ph0b, ph120b, and ph240b from the six signals q1, q2, q3, q4, q5, q6 as well as from direct and inverted forms of the input clock signal 325 (inversion of the input clock signal 325 in these cases is illustrated by the small circle at the inputs of the third, sixth, and seventh AND gates 327, 333, and 337). In this embodiment, the SUM blocks may be OR gates or XOR gates.

This part of the fractional frequency divider operates by using the input clock signal 325 to gate desired parts of each of the six signals q1, q2, q3, q4, q5, q6. The six signals q1, q2, q3, q4, q5, q6 are then selectively combined (by means of the first, second, and third SUM blocks 339, 341, and 343) to generate the desired output signals ph0b, ph120b, and ph240b as illustrated in FIG. 3B. For example, the signal ph0b can be generated in accordance with the following Boolean expression:

ph0b=(q1 AND (NOT clock)) OR (q4 AND clock)

Thus, the signal ph0b is asserted at time=t1 when q1 is asserted and the clock is not asserted, and then again at time=t2 when q4 is asserted and the clock is asserted.

The various combinations of the six signals q1, q2, q3, q4, q5, q6 with the clock signal are made such that there is a phase difference of 2π/3 between any two of the output signals ph0b, ph120b, and ph240b.

In some embodiments, one or more of the output signals x(t), x(t−$T_x$/3), and x(t−2$T_x$/3) (or equivalently ph0b, ph120b, and ph240b) are processed to generate mixer signals having a relative phase difference of π/2, and preferably also a duty cycle of 50%. For example, the relative phase of the signals that drive the mixers can be changed by means of phase shift circuitry or by means of low-pass filters. Such embodiments enable the transmitter (and receiver) to use a "standard" design for the low-frequency part.

Processing the output signals x(t), x(t−$T_x$/3), and x(t−2$T_x$/3) in such a manner has certain drawbacks, however. One of these is a deterioration of the accuracy of the relative phase as a function of temperature, component spread and matching. This increases the likelihood that an unwanted image signal will be present in the output signal due to an unwanted difference between, on the one hand, the phase difference between the low frequency signals and, on the other, the phase difference between the signals that drive the mixers. With respect to the receive chain, the image rejection property of the receiver will also be seriously degraded.

Another reason to avoid any extra signal processing of the high frequency signals that drive the mixers is the desire to drive the mixers with signals that have steep slopes in order to make the mixers switch state as fast as possible (for reasons relating to noise and distortion). Any filtering of the original signals will decrease the slope of these signals and might decrease the performance or, alternatively, require additional power when additional buffer circuits are inserted behind these filters in order to improve the slope of the filtered signals.

In accordance with another aspect of the invention, embodiments of transmitters and receivers are capable of directly utilizing any two outputs from the fractional frequency divider 201 without the need for any conditioning circuitry to impose a 90° phase relationship between these signals. (In fact, in practice it is not necessary to actually generate all three of the outputs illustrated in FIGS. 2A and 2B; fractional frequency dividers that generate only any two of them would suffice.) It has conventionally been thought that in order to generate the transmitter signal without generating an (in-channel) image-signal, exact quadrature signals are required in both the low-frequency paths and the local-oscillator paths. However, it can be shown that, given the relative phase of α (where α can be a positive or negative value) between the two high frequency mixer signals (e.g., the 2π/3 radians difference between any two output-signals of the fractional divider 201), image-rejection can be accomplished by also setting the relative difference between the two low-frequency paths to α. (In practice, this is easy to accomplish in the digital domain.) More specifically, providing the same phase difference between the low frequency I- and Q-path signals and the high frequency mixer signals yields, after combining the mixed signals, an output $u_0(t)$ given by:

$$u_0(t) = \cos(\omega_0 t) \cdot \cos(\theta(t)) - \cos(\omega_0 t + \alpha) \cdot \cos(\theta(t) + \alpha)$$

$$= \frac{1}{2}\cos(\omega_0 t + \theta(t)) + \frac{1}{2}\cos(\omega_0 t - \theta(t)) -$$

$$\frac{1}{2}\cos(\omega_0 t + \theta(t) + 2\alpha) - \frac{1}{2}\cos(\omega_0 t - \theta(t))$$

$$= \frac{1}{2}\cos(\omega_0 t + \theta(t)) - \frac{1}{2}\cos(\omega_0 t + \theta(t) + 2\alpha)$$

$$= \sin(\alpha) \cdot \sin(\omega_0 t + \theta(t) + \alpha)$$

$$= \sin(\alpha) \cdot \cos(\omega_0 t + \theta(t) + \alpha - \pi/2)$$

This expression shows that, regardless of the value of α, no image rejection problems will occur (i.e., there are no signals with arguments of the form $\omega_0 t - \theta(t)$ present at the output). It can also be seen, however, that for values of α approaching 0 or π, the amplitude of the output signal will approach 0. Consequently, it is generally desirable to choose a value of α close to π/2 in order to minimize the loss in conversion gain compared to the maximum achievable conversion gain, which is achieved for α=±π/2.

Thus, given the relative phase of 2π/3 radians between any two output-signals of the fractional divider 201, image-rejection can be accomplished by also setting the relative difference between the two low-frequency paths to 2π/3 radians.

Figure 4:
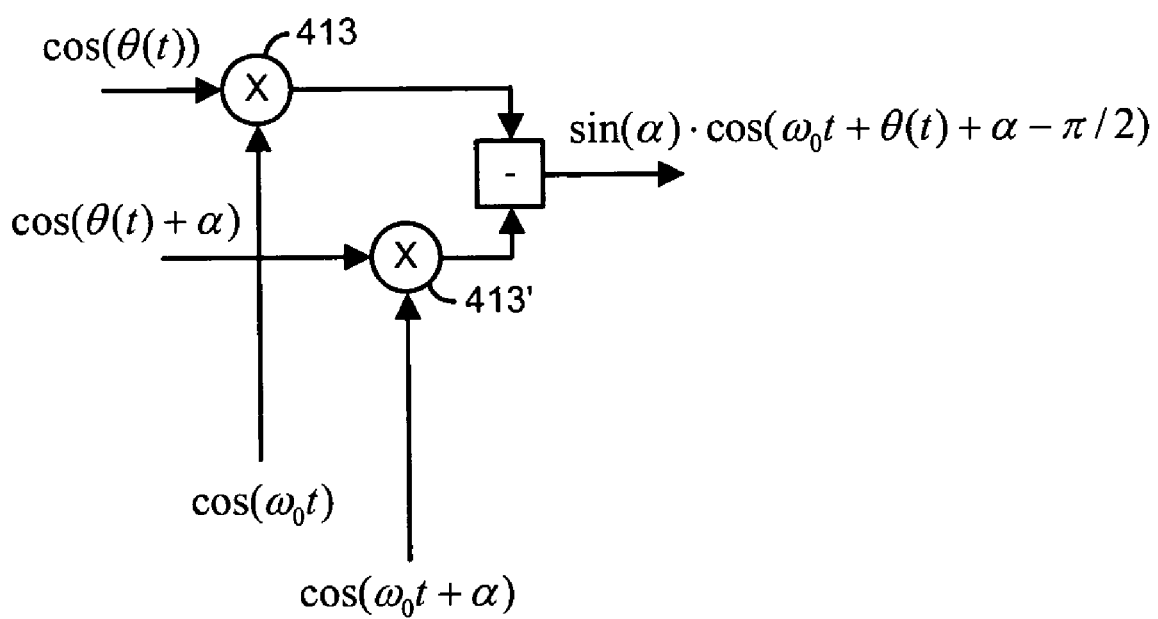
FIG. 4 is a block diagram of pertinent transmitter elements that compensate for an error in the relative phase difference between mixer signals supplied to the transmitter.

The pertinent transmitter elements for doing so are depicted in the block diagram of FIG. 4. Conventionally, the terms "in-phase" and "quadrature-phase" are used to denote signals whose relative phase difference has a magnitude of π/2 radians. To denote the more general case in which the relative phase difference between the two signals can be represented by α, the terms "in-phase" and "alternative-phase" will be used to respectively refer to the two signals, or to their associated transmitter and/or receiver paths. In all cases, the actual phase relationship between signals is expressly stated to eliminate any possibility for confusion. Here it can be seen that by ensuring that the relative phase difference between in-phase and alternative-phase signals supplied to respective first and second mixers 413, 413' is α (e.g., 2π/3 radians instead of π/2 radians), then the use of mixing signals whose relative phase difference is also α radians (e.g., also 2π/3 radians) results in an output having a phase offset of α−π/2 radians (=π/6 radians in the example), compared to a zero phase offset in the conventional transmitter depicted in FIG. 1. Thus, a "phase error" in the local oscillator signals of π/6 radians (with respect to ideal quadrature signals whose "correct" phase difference would be π/2 radians instead of 2π/3 radians) is compensated for by introducing the same phase error in the low-frequency in-phase and alternative-phase signal paths. It should be noted that, because the non-zero phase offset term present in the output waveform is constant, there is no degradation in the performance of any receiver that receives the transmitted signal.

Figure 5A:
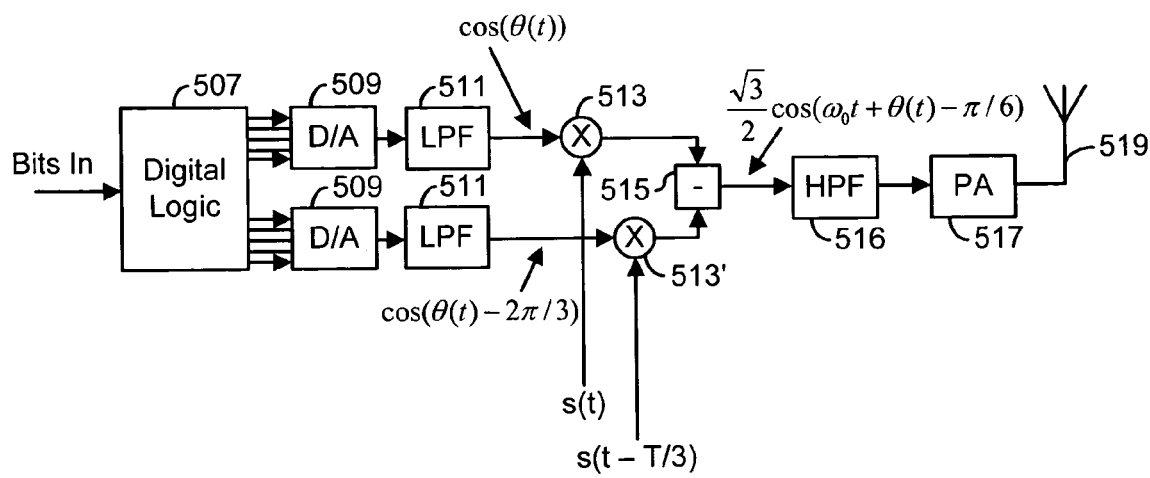
FIG. 5A is a block diagram of an exemplary transmitter in accordance with one or more aspects of the invention.

FIG. 5A is a block diagram of an exemplary transmitter 501 that utilizes the inventive concepts described above. In the transmitter 501, information in the form of bits to be transmitted are supplied to digital logic 507. The digital logic 507 may perform a number of functions, such as generating redundant bits in accordance with a Forward Error Correction (FEC) scheme (not shown). One function that the digital logic 507 does perform in this example is generating a pair of modulation signals $A(t)\cdot\cos(\theta(t))$ and $A(t)\cdot\cos(\theta(t)+-2\pi/3)$ from the supplied input bits. A(t) and θ(t) will depend on the type of modulation used in the transmitter (e.g., PSK, FSK, ASK, etc.). One of the signals $A(t)\cdot\cos(\theta(t))$ and $A(t)\cdot\cos(\theta(t)+-2\pi/3)$ is supplied to an in-phase transmit path, and the other of the two generated signals is supplied to a alternative-phase transmit path.

It will be observed, then, that in accordance with an aspect of the invention, the digital logic 507 includes suitable logic that results in the relative phase difference between the in-phase and alternative-phase signals being −2π/3 radians, instead of the conventional π/2 radians. Thus, it can be considered that a phase error of (−2π/3)−(π/2)=−7π/6 radians is introduced in the low-frequency in-phase and alternative-phase signal paths.

Figure 5B:
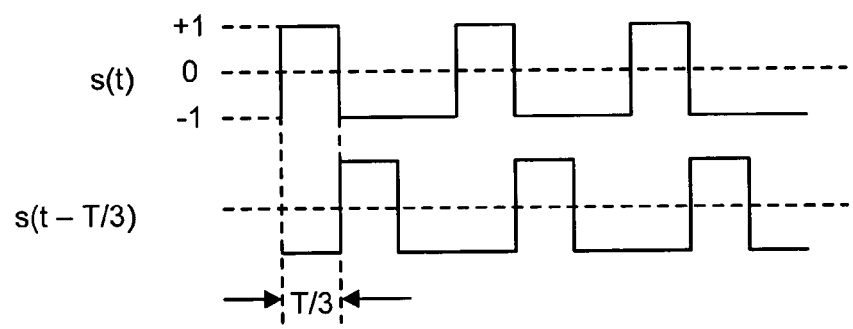
FIG. 5B is a timing diagram illustrating the shape and phase relationship between exemplary mixing signals supplied to the exemplary transmitter depicted in FIG. 5A.

In each of the in-phase and alternative-phase paths, the bits supplied by the digital logic 507 are converted to analog form by a digital to analog (D/A) converter 509. The analog signal supplied by the digital to analog converter 509 is then conditioned for transmission by a low pass filter (LPF) 511. The conditioned analog signal is then directly up-converted to the radio frequency that will be used for transmission by mixing the signal (via a respective one of the mixers 513, 513') with a respective one of the mixer signals (in this example, s(t) for in-phase, and s(t−T/3) for alternative phase) having a relative phase difference of −2π/3 radians, as earlier described. These mixer signals may, for example, be buffered output signals from the fractional frequency divider 201. FIG. 5B is a timing diagram illustrating the shape and phase relationship between the exemplary mixing signals, s(t) and s(t−T/3).

Returning now to a discussion of the transmitter 501, the in-phase and alternative-phase signals supplied by the mixers 513 and 513' are then combined 515 to generate an output, $u_o(t)$ equal to:

$$u_o(t) = -\sin\left(\frac{2\pi}{3}\right) \cdot \sin\left(\omega_o t + \theta(t) - \left(\frac{2\pi}{3}\right)\right)$$

$$= -\frac{\sqrt{3}}{2} \cdot \sin\left(\omega_o t + \theta(t) - \frac{2\pi}{3}\right)$$

$$= \frac{\sqrt{3}}{2} \cdot \sin\left(\omega_o t + \theta(t) + \frac{\pi}{3}\right)$$

$$= \frac{\sqrt{3}}{2} \cdot \cos\left(\omega_o t + \theta(t) - \frac{\pi}{6}\right)$$

Because the signals of the synthesizer do not have a 50% duty cycle, a corresponding DC-component is present in these signals. After multiplication with the low frequency signals in the transmitter, this DC-component will generate a signal at the output of the subtractor 515 around DC. To remove this DC component, the output of the subtractor 515 is preferably supplied to high pass filter (HPF) 516. Although it is possible to remove the DC-component at the input of the mixers (by inserting high pass filters, such as coupling capacitors, at the inputs of the mixers), this is not recommended because the average value of the switching signals for the mixers is not located in the middle of the two extremes of the switching levels; this can cause an asymmetric switching performance of the mixers (e.g, for small switching signals, the mixers can be driven to one state for one of the levels, but not fully to the other state for the other level), which will deteriorate the conversion gain and linearity and noise performance of the mixer transfer.

Continuing with the discussion of FIG. 5A, the output of the high pass filter 516 is then supplied to a power amplifier 517, which boosts the strength of the signal so that it can be transmitted through an antenna 519.

It should be noted that harmonics of the transmitter output signal will never coincide with the VCO frequency. Consequently, $$n \cdot \omega_0 \neq \omega_{VCO} = \frac{3}{2} \cdot \omega_0 \; n = 1, 2, 3, \ldots$$

where $\omega_0$ is the fundamental frequency of the transmitter output, and $\omega_{VCO}$ is the frequency of the VCO output. The minimum frequency difference between a harmonic of the transmitter output signal and the VCO frequency is $0.5 \cdot \omega_0$. For such a frequency difference, the VCO will virtually not be sensitive to pulling.

In another aspect of the invention, a receiver architecture and receiver techniques are provided that enable mixer signals having a relative phase difference of $2\pi/3$ radians to be used, instead of conventional mixer signals having a relative phase difference of $\pi/2$ radians. This is especially useful when such a receiver is incorporated with a transmitter to form a transceiver, since it permits these two units to share a common synthesizer.

To implement an image-reject low-IF receiver structure, it is necessary to take into account the fact that the fractional frequency divider 201 only generates signals having a relative phase difference of $2\pi/3$ radians. In a typical low-IF image reject system, the quadrature local oscillator signals convert the RF input signal to true quadrature IF signals (i.e., there is a $\pi/2$ radians relative phase difference between two IF signals). These quadrature IF signals are fed to a polyphase IF filter in order to suppress the image signal at a frequency distance of $2 \cdot f_{IF}$ from the wanted signal.

Figure 6:
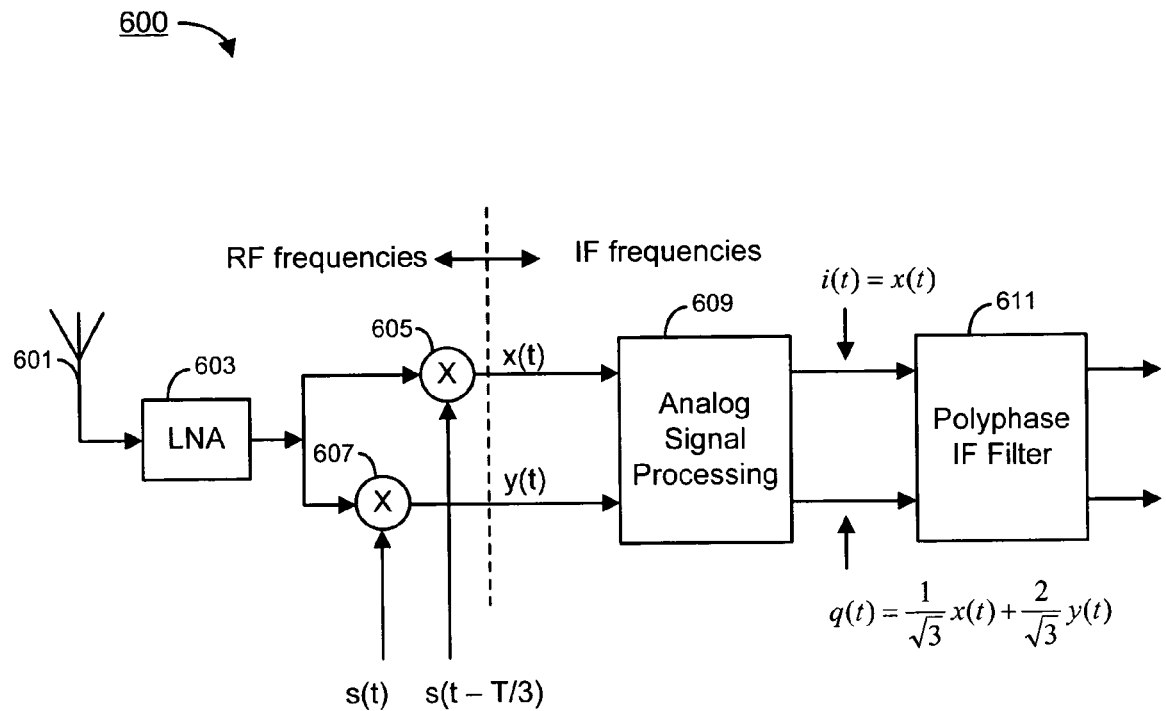
FIG. 6 is a block diagram of an exemplary receiver that includes elements that compensate for a relative phase error between mixer signals supplied to the receiver.

By adding some extra signal processing of the IF signals, it is still possible to implement a low-IF image-reject architecture, even when the local oscillator signals differ in phase by $2\pi/3$ radians instead of $\pi/2$ radians. As in the transmitter part, where a "phase error" in the local oscillator signals of $\pi/6$ radians (with respect to ideal quadrature signals) is compensated for by introducing the same phase-error in the low frequency signal paths, it is possible to compensate for this local oscillator "phase error" in the receive path by simple analog processing in the IF-paths of the receiver in front of the polyphase filter. A block diagram of an exemplary receiver 600 having this structure is shown in FIG. 6. Note that, unlike what is commonly done in conventional receivers, no signal processing is required in the local oscillator path.

In the exemplary receiver 600, signals are received by an antenna 601 and supplied to a low noise amplifier (LNA) 603. The amplified signal is then supplied to each of two signal paths: one for in-phase processing, and another for alternative-phase processing. The mixer signals have a relative phase difference of $2\pi/3$ radians. Thus, in this exemplary embodiment the in-phase received RF-signal is mixed with a first mixer signal, $s(t-T/3)$, by means of a first mixer 605, and the alternative-phase received RF-signal is mixed with a second mixer signal, $s(t)$, by means of a second mixer 607. The first mixed signal at the output of the first mixer 605 is denoted $x(t)$, and the second mixed signal at the output of the second mixer 607 is denoted $y(t)$. Because of the mixing, each of the signals $x(t)$, and $y(t)$ is in the IF frequency range.

The signals $x(t)$, and $y(t)$ are then supplied to an analog signal processing block 609. The function of the analog signal processing block 609 is to generate true ("ideal") quadrature signals (i.e., signals having a relative phase difference of $\pi/2$ radians) from input signals having a relative phase difference of $2\pi/3$ radians. In one embodiment, the analog signal processing block 609 accomplishes this by generating two output signals, an in-phase receiver signal $i(t)$ and a quadrature-phase receiver signal $q(t)$, such that $$i(t) = x(t)$$

$$q(t) = \frac{1}{\sqrt{3}} x(t) + \frac{2}{\sqrt{3}} y(t)$$

In all, no signal processing at the local oscillator frequencies is required.

In an alternative embodiment, the analog signal processing block 609 generates true quadrature signals from the IF-signals $x(t)$ and $y(t)$ by adding and subtracting the input signals $x(t)$ and $y(t)$, because this will always cause the output signals to have a relative phase difference of $\pi/2$ radians, irrespective of the relative phase difference of the input signals. For example, the analog signal processing block 609 can perform the following signal-processing:

$$i(t) = x(t) + y(t)$$

$$q(t) = \frac{1}{\sqrt{3}} x(t) - \frac{1}{\sqrt{3}} y(t)$$

This embodiment provides true quadrature signals having equal amplitudes. The gain factor $$\frac{1}{\sqrt{3}}$$

is necessary to obtain equal amplitudes, given the $2\pi/3$ radians relative phase difference between the input signals. Having equal amplitudes is important for suppression of the image signal in subsequent receiver processing.

Regardless of which embodiment is used to implement the analog signal processing block 609, the outputs of this block are then supplied to a polyphase IF filter 611. From this point on, the receiver 600 operates by means of well-known techniques which need not be described here in detail.

The exemplary embodiment depicted in FIG. 6 is specific to the case in which the relative phase difference, $\alpha$, between the two input signals is equal to $2\pi/3$. However, the invention can more broadly be considered to encompass the more general case in which $\alpha \neq \pi/2$. In such embodiments, the function of the analog signal processing block (such as the analog signal processing block 609) is to generate true ("ideal") quadrature signals (i.e., signals having a relative phase difference of $\pi/2$ radians) from input signals having a relative phase difference of $2\pi/3$ radians. Preferably, the generated quadrature signals will also have equal amplitude.

The various aspects of the invention described herein are capable of providing a number of advantages over conventional techniques. One of these is the provision of a complete transceiver system having a zero-IF upconversion transmitter-part and a low-IF, or zero-IF receiver-part, which avoids pulling of a VCO by having a non-integer relation between the VCO-frequency and harmonics of the transmitter output signal. In some embodiments, this is accomplished by setting the VCO-frequency to 3/2 times the desired local oscillator frequency and by dividing the actual local oscillator signals by 3/2, using a special fractional frequency divider, to arrive at the desired frequency. Note that any other value that satisfies $$f_{VCO} = \left(n + \frac{1}{2}\right) \cdot f_{RF}$$

with n=1, 2, 3, ... can be used as well.

The special fractional frequency divider in question implements a division-factor N=3/2 based on the positive-going as well as the negative-going slopes of the (buffered) VCO signal. This is in contrast to conventional frequency dividers which only use either the positive-going or negative-going slope of their input signal.

Another advantage that can be reaped is the ability to suppress the image signal in the transmitter output spectrum without the need for additional signal processing on high-frequency signals such as the local oscillator signals or the radio frequency signals generated by the transmitter. This is achieved by arranging for the low-frequency signals of the transmitter to have the same relative phase difference between the in-phase and the alternative-phase signal paths as the relative phase difference (e.g., $2\pi/3$ radians) between the two local oscillator signals generated by the fractional frequency divider (with N=3/2). In addition, no extra hardware is required in the low-frequency paths and the local oscillator paths of the transmitter, in contrast to conventional quadrature mixers in transmitter architectures.

Yet another advantage is that the same two oscillator-signals can also be used for low-IF (or zero-IF) receiver architectures, when some additional signal processing is added behind the two down-conversion mixers. The purpose of the additional signal processing is to generate true quadrature IF-signals. Again, only some additional processing at (very) low frequencies is required, which is beneficial for matching, compared to conventional solutions which require additional processing of the local oscillator signals.

Still another advantage is that the VCO does not have to run at twice the transmitter's output RF-frequency in order to generate local oscillator signals, but only at 3/2 times. This saves power in the VCO and also makes it less vulnerable to parasitic load-capacitances.

Because the harmonics of the transmitter output signal never coincide with the frequency of the VCO output signal, an additional degree of freedom in the design of the RF amplifiers is obtained because in systems with the VCO running at twice the RF-frequency, one must be very careful to avoid asymmetry in the RF waveform in order to avoid second harmonic signals and one must also minimize supply signals which contain the second harmonic of the RF-signal, because all these signals might pull the VCO. This requirement limits the design freedom of the RF-amplifier circuits in conventional solutions.

The following considerations should be kept in mind when contemplating the use of the invention. At the transmitter and receiver conversion, the conversion gain is less than that associated with a system utilizing ideal quadrature local oscillator signals. For an arbitrary phase difference of $\alpha$, the loss is equal to $\sin(\alpha)$. In the case of the exemplary embodiment, in which $\alpha=2\pi/3$, the relatively small loss is equal to $-1.25$ dB.

Also, the fractional frequency divider with N=3/2 is more complicated than the conventional divide-by-2 arrangement that is commonly used. In addition, the current consumption will be slightly higher with the new divider. But offsetting this is the fact that the operating frequency of the VCO and of the fractional frequency divider of this new system is only ¾ of the frequency of a conventional system with the VCO running at twice the output frequency. This implies that less current is required for the basic circuits in the new divider compared to the same basic circuits of the conventional system.

Another consideration is that, in a transceiver, some additional hardware is required in the IF-path of the receiver in order to generate the alternative-signals for the image-reject IF-filter. But the additional current consumption will be marginal because the power consumption of IF-amplifiers is usually very small compared to the overall power consumption of the receiver.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, other alternative embodiments are derived by adding bandpass selectivity circuits (e.g., tuned circuits and the like) to one or more output signals of the fractional frequency divider. Still other alternative embodiments are derived by connecting the outputs of the fractional frequency divider to the nodes of a 3-stage ring oscillator. These various techniques reduce spurious signals that can degrade the performance of the receiver (e.g., by blocking).

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A transmitter for use in a telecommunications system, comprising:

a first mixer that generates an in-phase radio frequency signal by mixing an in-phase baseband signal with a first radio frequency mixer signal;

a second mixer that generates an alternative-phase radio frequency signal by mixing an alternative-phase baseband signal with a second radio frequency mixer signal, wherein a relative phase-difference between the in-phase and alternative-phase baseband signals is $\alpha$ radians, wherein $|\alpha| \neq \pi/2$;

combining circuitry that generates an output signal for transmission by combining the in-phase radio frequency signal with the alternative-phase radio frequency signal, wherein the output signal has a frequency, $f_{RF}$; and a synthesizer that generates the first and second radio frequency mixer signals, the synthesizer comprising:

a voltage controlled oscillator (VCO) that generates a VCO output signal having a frequency, $f_{VCO}$, such that $$f_{VCO} = \left(n + \frac{1}{2}\right) \cdot f_{RF},$$

wherein n=1,2,3, . . . ; and circuitry, including a fractional frequency divider that generates the first and second radio frequency mixer signals from the VCO output signal, wherein each of the first and second radio frequency mixer signals has a frequency equal to $f_{RF}$, and wherein a relative phase difference between the first and second radio frequency mixer signals is α radians, wherein:

n=1;

the fractional frequency divider is a divide-by-N fractional frequency divider with N=3/2, and the fractional frequency divider comprises:

logic that, for every three successive transitions of the VCO output signal, generates a first fractional frequency divider output signal such that the first fractional frequency divider output signal transitions in response to each of first and second transitions of the three successive transitions of the VCO output signal, and the first fractional frequency divider output signal remains steady in response to a third transition of the three successive transitions of the VCO output signal; and logic that, for said every three successive transitions of the VCO output signal, generates a second fractional frequency divider output signal such that the second fractional frequency divider output signal transitions in response to each of the second and third transitions of the three successive transitions of the VCO output signal, and the second fractional frequency divider output signal remains steady in response to the first transition of the three successive transitions of the VCO output signal.

2. The transmitter of claim 1, wherein |α|=2π/3.

3. The transmitter of claim 1, comprising:

logic that generates the in-phase and alternative-phase baseband signals.

4. The transmitter of claim 1, wherein:

the synthesizer circuitry further comprises a buffer that receives the first and second fractional frequency divider output signals, and generates therefrom the first and second radio frequency mixer signals.

5. A transceiver comprising:

the transmitter of claim 1; and a receiver comprising:

a first mixer that generates a first mixed signal by mixing a received radio frequency signal with a third radio frequency mixer signal;

a second mixer that generates a second mixed signal by mixing the received radio frequency signal with a fourth radio frequency mixer signal, wherein a relative phase difference between the third and fourth radio frequency mixer signals is α radians; and processing circuitry that receives the first and second mixed signals and generates therefrom an in-phase receiver signal and a quadrature-phase receiver signal, wherein a relative phase difference between the in-phase receiver signal and the quadrature-phase receiver signal is π/2 radians.

6. The transceiver of claim 5, wherein:

the third radio frequency mixer signal is the first radio frequency mixer signal; and the fourth radio frequency mixer signal is the second radio frequency mixer signal.

7. A transceiver comprising:

a transmitter for use in a telecommunications system, comprising:

a first mixer that generates an in-phase radio frequency signal by mixing an in-phase baseband signal with a first radio frequency mixer signal;

a second mixer that generates an alternative-phase radio frequency signal by mixing an alternative-phase baseband signal with a second radio frequency mixer signal, wherein a relative phase-difference between the in-phase and alternative-phase baseband signals is α radians, wherein |α|≠π/2;

combining circuitry that generates an output signal for transmission by combining the in-phase radio frequency signal with the alternative-phase radio frequency signal, wherein the output signal has a frequency, $f_{RF}$; and a synthesizer that generates the first and second radio frequency mixer signals, the synthesizer comprising:

a voltage controlled oscillator (VCO) that generates a VCO output signal having a frequency, $f_{VCO}$, such that $$f_{VCO} = \left(n + \frac{1}{2}\right) \cdot f_{RF},$$

wherein n=1,2,3, . . . ; and circuitry, including a fractional frequency divider that generates the first and second radio frequency mixer signals from the VCO output signal, wherein each of the first and second radio frequency mixer signals has a frequency equal to $f_{RF}$, and wherein a relative phase difference between the first and second radio frequency mixer signals is α radians; and a receiver comprising:

a first mixer that generates a first mixed signal by mixing a received radio frequency signal with a third radio frequency mixer signal;

a second mixer that generates a second mixed signal by mixing the received radio frequency signal with a fourth radio frequency mixer signal, wherein a relative phase difference between the third and fourth radio frequency mixer signals is α radians; and processing circuitry that receives the first and second mixed signals and generates therefrom an in-phase receiver signal and a quadrature-phase receiver signal, wherein a relative phase difference between the in-phase receiver signal and the quadrature-phase receiver signal is π/2 radians, wherein:

α=2π/3; and the processing circuitry generates the in-phase receiver signal, i(t), and the quadrature-phase receiver signal, q(t), from the first mixed signal, x(t), and the second mixed signal, y(t), in accordance with:

$$i(t)=x(t)$$

$$q(t) = \frac{1}{\sqrt{3}}x(t) + \frac{2}{\sqrt{3}}y(t).$$

8. A transceiver comprising:
a transmitter for use in a telecommunications system, comprising:
a first mixer that generates an in-phase radio frequency signal by mixing an in-phase baseband signal with a first radio frequency mixer signal;
a second mixer that generates an alternative-phase radio frequency signal by mixing an alternative-phase baseband signal with a second radio frequency mixer signal, wherein a relative phase-difference between the in-phase and alternative-phase baseband signals is $\alpha$ radians, wherein $|\alpha|\neq\pi/2$;
combining circuitry that generates an output signal for transmission by combining the in-phase radio frequency signal with the alternative-phase radio frequency signal, wherein the output signal has a frequency, $f_{RF}$; and
a synthesizer that generates the first and second radio frequency mixer signals, the synthesizer comprising:
a voltage controlled oscillator (VCO) that generates a VCO output signal having a frequency, $f_{VCO}$, such that $$f_{VCO} = \left(n + \frac{1}{2}\right) \cdot f_{RF},$$

wherein n=1,2,3, . . . ; and
circuitry, including a fractional frequency divider that generates the first and second radio frequency mixer signals from the VCO output signal, wherein each of the first and second radio frequency mixer signals has a frequency equal to $f_{RF}$, and wherein a relative phase difference between the first and second radio frequency mixer signals is $\alpha$ radians; and
a receiver comprising:
a first mixer that generates a first mixed signal by mixing a received radio frequency signal with a third radio frequency mixer signal;
a second mixer that generates a second mixed signal by mixing the received radio frequency signal with a fourth radio frequency mixer signal, wherein a relative phase difference between the third and fourth radio frequency mixer signals is $\alpha$ radians; and
processing circuitry that receives the first and second mixed signals and generates therefrom an in-phase receiver signal and a quadrature-phase receiver signal, wherein a relative phase difference between the in-phase receiver signal and the quadrature-phase receiver signal is $\pi/2$ radians,
wherein:
the processing circuitry generates the in-phase receiver signal, i(t), in accordance with a first function that includes adding the first mixed signal, x(t), and the second mixed signal, y(t); and
the processing circuitry generates the quadrature-phase receiver signal, q(t), in accordance with a second function that includes determining a difference between the first mixed signal, x(t), and the second mixed signal, y(t).

9. The transceiver of claim 8, wherein:
$\alpha=2\pi/3$;
the first function is:

$$i(t)=x(t)+y(t);$$

and the second function is:

$$q(t) = \frac{1}{\sqrt{3}}x(t) - \frac{1}{\sqrt{3}}y(t).$$

10. A receiver comprising:
a synthesizer that generates a first mixer signal and a second mixer signal, wherein a relative phase difference between the first and second mixer signals is a predetermined value, $\alpha$ radians, wherein $|\alpha|\neq\pi/2$;
a first mixer that generates a first mixed signal by mixing a received radio frequency signal with the first mixer signal;
a second mixer that generates a second mixed signal by mixing the received radio frequency signal with the second mixer signal; and
processing circuitry that receives the first and second mixed signals and, without requiring any other mixed signals, generates therefrom an in-phase receiver signal and a quadrature-phase receiver signal, wherein a relative phase difference between the in-phase receiver signal and the quadrature-phase receiver signal is $\pi/2$ radians.

11. The receiver of claim 10, wherein $|\alpha|=2\pi/3$.
12. The receiver of claim 10, wherein:
$\alpha=2\pi/3$; and
the processing circuitry generates the in-phase receiver signal, i(t), and the quadrature-phase receiver signal, q(t), from the first mixed signal, x(t), and the second mixed signal, y(t), in accordance with:

$$i(t)=x(t)$$

$$q(t) = \frac{1}{\sqrt{3}}x(t) + \frac{2}{\sqrt{3}}y(t).$$

13. The receiver of claim 10, wherein:
the processing circuitry generates the in-phase receiver signal, i(t), in accordance with a first function that includes adding the first mixed signal, x(t), and the second mixed signal, y(t); and
the processing circuitry generates the quadrature-phase receiver signal, q(t), in accordance with a second function that includes determining a difference between the first mixed signal, x(t), and the second mixed signal, y(t).

14. The receiver of claim 13, wherein:
$\alpha=2\pi/3$;
the first function is:

$$i(t)=x(t)+y(t);$$

and the second function is:

$$q(t) = \frac{1}{\sqrt{3}}x(t) - \frac{1}{\sqrt{3}}y(t).$$

15. A method of generating an output signal for transmission in a telecommunications system, the method comprising:
    generating an in-phase radio frequency signal by mixing an in-phase baseband signal with a first radio frequency mixer signal;
    generating an alternative-phase radio frequency signal by mixing an alternative-phase baseband signal with a second radio frequency mixer signal, wherein a relative phase difference between the in-phase and alternative-phase baseband signals is α radians, wherein |α|≠π/2;
    generating an output signal for transmission by combining the in-phase radio frequency signal with the alternative-phase radio frequency signal, wherein the output signal has a frequency, $f_{RF}$; and
    generating the first and second radio frequency mixer signals by performing:
        generating a voltage controlled oscillator (VCO) output signal having a frequency, $f_{VCO}$, such that $$f_{VCO} = \left(n + \frac{1}{2}\right) \cdot f_{RF},$$

wherein n=1,2,3, . . . ; and
        generating the first and second radio frequency mixer signals from the VCO output signal, wherein each of the first and second radio frequency mixer signals has a frequency equal to $f_{RF}$,
    wherein:
    n=1;
    generating the first and second radio frequency mixer signals includes dividing the VCO output signal by an amount N, where N=3/2;
    generating the first radio frequency mixer signal comprises, for every three successive transitions of the VCO output signal, generating a first fractional frequency divided signal such that the first fractional frequency divided signal transitions in response to each of first and second transitions of the three successive transitions of the VCO output signal, and the first fractional frequency divided signal remains steady in response to a third transition of the three successive transitions of the VCO output signal; and
    generating the second radio frequency mixer signal comprises, for said every three successive transitions of the VCO output signal, generating a second fractional frequency divided signal such that the second fractional frequency divided signal transitions in response to each of the second and third transitions of the three successive transitions of the VCO output signal, and the second fractional frequency divided signal remains steady in response to the first transition of the three successive transitions of the VCO output signal.

16. The method of claim 15, wherein |α|=2π/3.

17. The method of claim 15, comprising:
    generating the in-phase and alternative-phase baseband signals.

18. The method of claim 15, comprising:
    generating, from the first and second fractional frequency divided signals, the first and second radio frequency mixer signals.

19. The method of claim 15, further comprising a receiver process that comprises:
    generating a first mixed signal by mixing a received radio frequency signal with a third radio frequency mixer signal;
    generating a second mixed signal by mixing the received radio frequency signal with a fourth radio frequency mixer signal, wherein a relative phase difference between the third and fourth radio frequency mixer signals is α radians; and
    generating, from the first and second mixed signals, an in-phase receiver signal and a quadrature-phase receiver signal, wherein a relative phase difference between the in-phase receiver signal and the quadrature-phase receiver signal is π/2 radians.

20. The method of claim 19, wherein:
    the third radio frequency mixer signal is the first radio frequency mixer signal; and
    the fourth radio frequency mixer signal is the second radio frequency mixer signal.

21. A method of generating an output signal for transmission in a telecommunications system, the method comprising:
    generating an in-phase radio frequency signal by mixing an in-phase baseband signal with a first radio frequency mixer signal;
    generating an alternative-phase radio frequency signal by mixing an alternative-phase baseband signal with a second radio frequency mixer signal, wherein a relative phase difference between the in-phase and alternative-phase baseband signals is α radians, wherein |α|≠π/2;
    generating an output signal for transmission by combining the in-phase radio frequency signal with the alternative-phase radio frequency signal, wherein the output signal has a frequency, $f_{RF}$; and
    generating the first and second radio frequency mixer signals by performing:
        generating a voltage controlled oscillator (VCO) output signal having a frequency, $f_{VCO}$, such that $$f_{VCO} = \left(n + \frac{1}{2}\right) \cdot f_{RF},$$

wherein n=1,2,3, . . . ; and
        generating the first and second radio frequency mixer signals from the VCO output signal, wherein each of the first and second radio frequency mixer signals has a frequency equal to $f_{RF}$,
    wherein n=1,
    the method further comprises a receiver process that comprises:
        generating a first mixed signal by mixing a received radio frequency signal with a third radio frequency mixer signal;
        generating a second mixed signal by mixing the received radio frequency signal with a fourth radio frequency mixer signal, wherein a relative phase difference between the third and fourth radio frequency mixer signals is α radians; and
        generating, from the first and second mixed signals, an in-phase receiver signal and a quadrature-phase receiver signal, wherein a relative phase difference between the in-phase receiver signal and the quadrature-phase receiver signal is π/2 radians,
    and wherein:
    α=2π/3; and the method comprises generating the in-phase receiver signal, i(t), and the quadrature-phase receiver signal, q(t), from the first mixed signal, x(t), and the second mixed signal, y(t), in accordance with:

$$i(t)=x(t)$$

$$q(t) = \frac{1}{\sqrt{3}}x(t) + \frac{2}{\sqrt{3}}y(t).$$

22. A method of generating an output signal for transmission in a telecommunications system, the method comprising:
generating an in-phase radio frequency signal by mixing an in-phase baseband signal with a first radio frequency mixer signal;
generating an alternative-phase radio frequency signal by mixing an alternative-phase baseband signal with a second radio frequency mixer signal, wherein a relative phase difference between the in-phase and alternative-phase baseband signals is $\alpha$ radians, wherein $|\alpha|\neq\pi/2$;
generating an output signal for transmission by combining the in-phase radio frequency signal with the alternative-phase radio frequency signal, wherein the output signal has a frequency, $f_{RF}$; and
generating the first and second radio frequency mixer signals by performing:
generating a voltage controlled oscillator (VCO) output signal having a frequency, $f_{VCO}$, such that $$f_{VCO} = \left(n + \frac{1}{2}\right) \cdot f_{RF},$$

wherein n=1,2,3, . . . ; and
generating the first and second radio frequency mixer signals from the VCO output signal, wherein each of the first and second radio frequency mixer signals has a frequency equal to $f_{RF}$,
wherein n=1,
the method further comprises a receiver process that comprises:
generating a first mixed signal by mixing a received radio frequency signal with a third radio frequency mixer signal;
generating a second mixed signal by mixing the received radio frequency signal with a fourth radio frequency mixer signal, wherein a relative phase difference between the third and fourth radio frequency mixer signals is $\alpha$ radians; and
generating, from the first and second mixed signals, an in-phase receiver signal and a quadrature-phase receiver signal, wherein a relative phase difference between the in-phase receiver signal and the quadrature-phase receiver signal is $\pi/2$ radians,
and wherein the method further comprises:
generating the in-phase receiver signal, i(t), in accordance with a first function that includes adding the first mixed signal, x(t), and the second mixed signal, y(t); and
generating the quadrature-phase receiver signal, q(t), in accordance with a second function that includes determining a difference between the first mixed signal, x(t), and the second mixed signal, y(t).

23. The method of claim 22, wherein:
$\alpha=2\pi/3$;
the first function is:

$$i(t)=x(t)+y(t);$$

and the second function is:

$$q(t) = \frac{1}{\sqrt{3}}x(t) - \frac{1}{\sqrt{3}}y(t).$$

24. A receiver method in a telecommunications system, the method comprising:
generating a first mixer signal and a second mixer signal, wherein a relative phase difference between the first and second mixer signals is predetermined value, $\alpha$ radians, wherein $|\alpha|\neq\pi/2$;
generating a first mixed signal by mixing a received radio frequency signal with the first mixer signal;
generating a second mixed signal by mixing the received radio frequency signal with the second mixer signal; and
generating, from the first and second mixed signals, an in-phase receiver signal and a quadrature-phase receiver signal, wherein a relative phase difference between the in-phase receiver signal and the quadrature-phase receiver signal is $\pi/2$ radians, and wherein generating the in-phase receiver signal and the quadrature-phase receiver signal is performed without requiring any other mixed signals to be provided.

25. The method of claim 24, wherein $|\alpha|=2\pi/3$.

26. The method of claim 24, wherein:
$\alpha=2\pi/3$; and
the in-phase receiver signal, i(t), and the quadrature-phase receiver signal, q(t), are generated from the first mixed signal, x(t), and the second mixed signal, y(t), in accordance with:

$$i(t)=x(t)$$

$$q(t) = \frac{1}{\sqrt{3}}x(t) - \frac{2}{\sqrt{3}}y(t).$$

27. The method of claim 24, wherein:
the in-phase receiver signal, i(t), is generated in accordance with a first function that includes adding the first mixed signal, x(t), and the second mixed signal, y(t); and
the quadrature-phase receiver signal, q(t), is generated in accordance with a second function that includes determining a difference between the first mixed signal, x(t), and the second mixed signal, y(t).

28. The method of claim 27, wherein:
$\alpha=2\pi/3$;
the first function is:

$$i(t)=x(t)+y(t);$$

and the second function is:

$$q(t) = \frac{1}{\sqrt{3}}x(t) - \frac{1}{\sqrt{3}}y(t).$$

* * * * *

UNITED STATES PATENT AND TRADEMARK OFFICE
CERTIFICATE OF CORRECTION

PATENT NO. : 7,480,343 B2  Page 1 of 1
APPLICATION NO. : 10/884970
DATED : January 20, 2009
INVENTOR(S) : Eikenbroek et al.

It is certified that error appears in the above-identified patent and that said Letters Patent is hereby corrected as shown below:

In Column 1, Line 41, delete "modem" and insert -- modern --, therefor.

In Column 1, Line 47, delete "modem" and insert -- modern --, therefor.

Signed and Sealed this

Second Day of June, 2009

JOHN DOLL
*Acting Director of the United States Patent and Trademark Office*